(12) United States Patent
Ouchi et al.

(10) Patent No.: US 8,779,864 B2
(45) Date of Patent: Jul. 15, 2014

(54) OSCILLATOR HAVING NEGATIVE RESISTANCE ELEMENT

(75) Inventors: Toshihiko Ouchi, Machida (JP); Ryota Sekiguchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 3 days.

(21) Appl. No.: 13/384,223

(22) PCT Filed: Aug. 13, 2010

(86) PCT No.: PCT/JP2010/064036
§ 371 (c)(1),
(2), (4) Date: Jan. 13, 2012

(87) PCT Pub. No.: WO2011/027671
PCT Pub. Date: Mar. 10, 2011

(65) Prior Publication Data
US 2012/0105161 A1 May 3, 2012

(30) Foreign Application Priority Data

Sep. 7, 2009 (JP) ................................. 2009-205673

(51) Int. Cl.
*H03B 7/14* (2006.01)
(52) U.S. Cl.
USPC ........... 331/115; 331/107 T; 331/132; 331/96
(58) Field of Classification Search
USPC ......... 331/107 T, 107 G, 115, 132, 96, 117 D
See application file for complete search history.

(56) References Cited

U.S. PATENT DOCUMENTS

| | | |
|---|---|---|
| 5,539,761 A | 7/1996 | Golub et al. |
| 5,586,131 A | 12/1996 | Ono et al. |
| 5,659,560 A | 8/1997 | Ouchi et al. |
| 5,699,373 A | 12/1997 | Uchida et al. |
| 5,764,670 A | 6/1998 | Ouchi |
| 6,854,901 B1 | 2/2005 | Ouchi |
| 7,062,116 B2 | 6/2006 | Ouchi |
| 7,248,995 B2 | 7/2007 | Itsuji et al. |
| 7,386,024 B2 | 6/2008 | Sekiguchi et al. |
| 7,463,104 B2 | 12/2008 | Sekiguchi et al. |
| 7,557,588 B2 | 7/2009 | Ouchi et al. |
| 7,560,695 B2 | 7/2009 | Kasai et al. |
| 7,564,034 B2 | 7/2009 | Ouchi |
| 7,630,588 B2 | 12/2009 | Ouchi |

(Continued)

FOREIGN PATENT DOCUMENTS

| | | | |
|---|---|---|---|
| JP | 2007-124250 A | 5/2007 | |
| WO | 2010/109841 A1 | 9/2010 | |

OTHER PUBLICATIONS

U.S. Appl. No. 13/384,222, filed Jan. 13, 2012. Applicant: Sekiguchi, et al.

(Continued)

*Primary Examiner* — Joseph Chang
(74) *Attorney, Agent, or Firm* — Fitzpatrick, Cella, Harper & Scinto (57) ABSTRACT

An oscillator has a negative resistance element and a resonator along with a capacitor electrically connected in parallel with the negative resistance element relative to a power bias circuit, a capacitance of the capacitor being so selected as to suppress any parasitic oscillation due to the power bias circuit and allow oscillation at a resonance frequency due to the negative resistance element and the resonator.

16 Claims, 4 Drawing Sheets

(56) References Cited

U.S. PATENT DOCUMENTS

| | | |
|---|---|---|
| 7,681,434 B2 | 3/2010 | Ouchi |
| 7,683,778 B2 | 3/2010 | Ouchi |
| 7,684,455 B2 | 3/2010 | Ouchi et al. |
| 7,688,078 B2 | 3/2010 | Miyazaki et al. |
| 7,689,070 B2 | 3/2010 | Ouchi |
| 7,701,587 B2 | 4/2010 | Shioda et al. |
| 7,709,797 B2 | 5/2010 | Sekiguchi et al. |
| 7,745,791 B2 | 6/2010 | Kasai et al. |
| 7,782,067 B2 | 8/2010 | Ouchi et al. |
| 7,869,036 B2 | 1/2011 | Kajiki et al. |
| 7,889,015 B2 | 2/2011 | Sekiguchi et al. |
| 7,922,659 B2 | 4/2011 | Itsuji et al. |
| 7,924,107 B2 | 4/2011 | Koyama et al. |
| 7,933,305 B2 | 4/2011 | Ouchi et al. |
| 7,953,130 B2 | 5/2011 | Ouchi et al. |
| 7,963,168 B2 | 6/2011 | Ouchi |
| 7,977,116 B2 | 7/2011 | Kasai et al. |
| 2003/0122628 A1* | 7/2003 | Aikawa et al. ............ 331/107 G |
| 2009/0198466 A1 | 8/2009 | Kajiki et al. |
| 2010/0171735 A1 | 7/2010 | Tung |
| 2010/0252738 A1 | 10/2010 | Kasai et al. |
| 2011/0089516 A1 | 4/2011 | Sekiguchi |
| 2011/0198501 A1 | 8/2011 | Ouchi et al. |
| 2011/0210252 A1 | 9/2011 | Ouchi et al. |
| 2011/0248724 A1 | 10/2011 | Sekiguchi |

OTHER PUBLICATIONS

U.S. Appl. No. 13/384,758, filed Jan. 18, 2012. Applicant: Koyama, et al.

Reddy, M., et al., Bias Stabilzation for Resonant Tunnel Diode Oscillators, IEEE Microwave and Guided Wave Letters, vol. 5, No. 7, pp. 219-221, Jul. 1995.

Reddy, M., et al., Monolithic Schottky-Collector Resonant Tunnel Diode Oscillator Arrays to 650 GHz, IEEE Electron Device Letters, vol. 18, No. 5, pp. 218-221, May 1997.

International Preliminary Report on Patentability dated Mar. 22, 2012 in corresponding PCT Patent Application No. PCT/JP2010/064036.

Korean Office Action dated Jun. 26, 2013 issued in corresponding Korean Patent Application No. 10-2012-7008595.

M. Reddy, "Bias Stabilization for Resonant Tunnel Diode Oscillators", 8099a IEEE, Jul. 1995, No. 7.

Chinese Office Action dated Mar. 24, 2014 in corresponding Chinese Application No. 201080039684.6 (whole English translation).

* cited by examiner

OSCILLATOR HAVING NEGATIVE RESISTANCE ELEMENT

TECHNICAL FIELD

The present invention relates to an oscillator and, more particularly, to a current injection type oscillator oscillating an electromagnetic wave including at least a part thereof a frequency component in a frequency region from the millimeter wave band to the terahertz wave band (more than 30 GHz and not more than 30 THz). More detailedly, the present invention relates to a current injection type oscillator having a negative resistance element such as an element having a resonant tunneling diode structure.

BACKGROUND ART

Non-destructive sensing techniques using electromagnetic waves in a frequency region from the millimeter wave band to the terahertz wave band (more than 30 GHz and not more than 30 THz) have been developed. Fields of application of electromagnetic waves of the frequency bands cover imaging techniques using safe fluoroscopic examination apparatus that replace X-ray apparatus. Techniques such as a spectroscopic technique of examining physical properties of a substance such as the state of bonding by determining the absorption spectrum and/or the complex dielectric constant in the inside of the substance, a biomolecular analysis technique and a technique of evaluating a carrier concentration and mobility have been developed. Additionally, development of examination apparatus for examining the presence or absence of a substance showing an absorption spectrum specific to the terahertz band, or a so-called fingerprint spectrum, is being discussed. Such an examination apparatus can operate for high-speed examination when it is discretely provided with oscillators having respective oscillation frequencies (typically from 0.1 THz to 10 THz) near the fingerprint spectrum of the substance to be examined because it does not involve any sweep in the time domain or the frequency domain.

Figure 5:
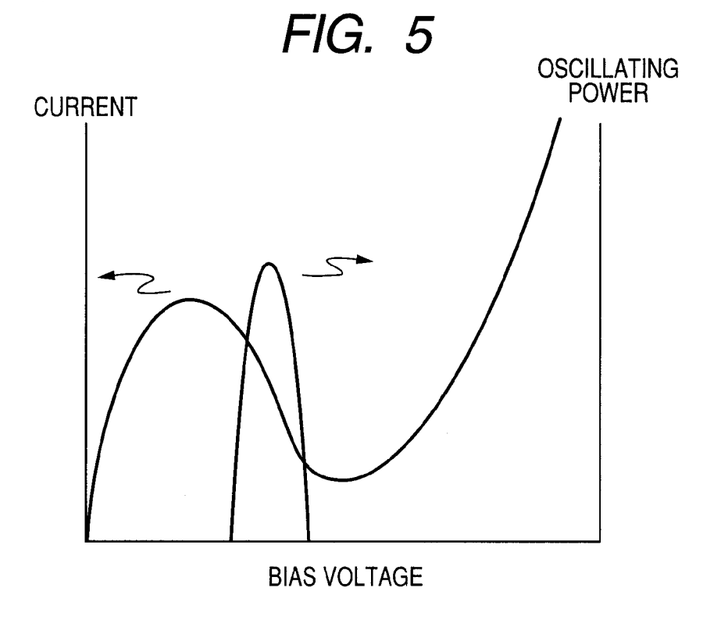
FIG. 5 is a schematic illustration of oscillation of a negative resistance element.

Means for generating a terahertz wave include those adapted to generate a pulse wave by irradiating a photoconductive element with light from a femtosecond laser and those for parametric oscillations that are adapted to generate a wave of a specific frequency by irradiating a non-linear crystal with light from a nanosecond laser. However, all such means are based on light excitation and face limits for downsizing and reduction of power consumption. Thus, structures using a quantum cascade laser or resonant tunneling diode (RTD) as current injection type element for operating in the region of terahertz waves are being discussed. Particularly, research efforts are being paid on the latter, or resonant tunneling diode type elements, as they operate near 1 THz at room temperature (see Patent Literature (PTL) 1 and Non-Patent Literature (NPL) 1). Such elements are typically formed by using quantum wells including GaAs/AlGaAs or InGaAs/InAlAs produced by way of lattice-matching-based epitaxial growth on GaAs or InP substrate. The element oscillates as the voltage is biased near the negative resistance region of the voltage/current (V-I) characteristic as illustrated in FIG. 5. A flat antenna structure formed on the substrate as illustrated in PTL 1 is employed as resonator structure for oscillation.

Figure 6:
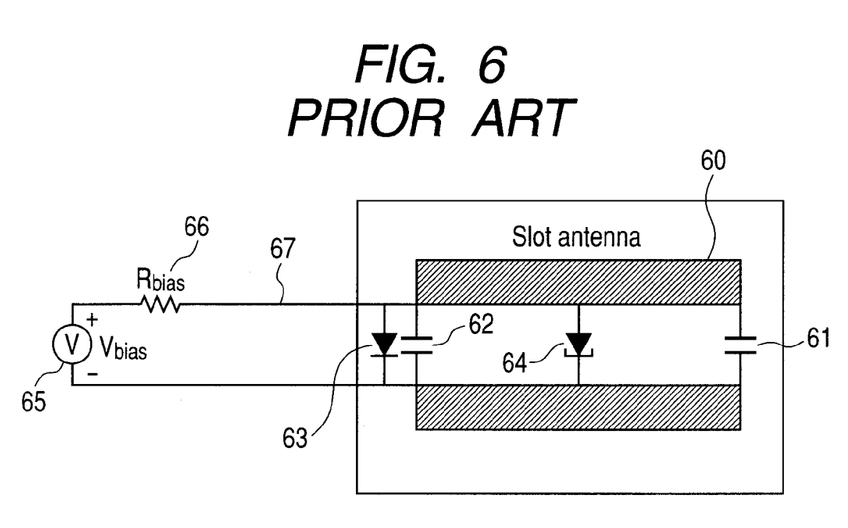
FIG. 6 is a schematic illustration of a known oscillator.

Such an RTD element shows a gain over a wide frequency region. Therefore, it is necessary to suppress the parasitic oscillation attributable to resonance points of relatively low frequencies other than the desired oscillation that is generated as a result of connecting a power bias circuit to the RTD element. The parasitic oscillation is suppressed by connecting a resistor in PTL 1, or a diode element 63 in NPL 1 as illustrated in FIG. 6 in parallel with an RTD element 64. Note that, in FIG. 6, 60 denotes a transmission line that also operates as slot antenna for taking out the oscillation output and 61 and 62 denote the capacity elements at the terminal sections of the transmission line. An oscillator is formed by 60, 61, 62 and 64. 65 denotes a power source (Vbias) for applying a voltage to the RTD element 64 and 66 shows the sum (Rbias) of the internal resistance of the power source 65 and the resistance that connection line 67 has. A power bias circuit is formed by 65, 66 and 67.

CITATION LIST

Patent Literature

PTL 1: Japanese Patent Application Laid-Open No. 2007-124250

Non-Patent Literature

NPL 1: IEEE Electron Device Letters, vol. 18, 1997, pp. 218-221

NPL 2: IEEE MICROWAVE AND GUIDE WAVE LETTERS, VOL. 5, NO. 7, JULY 1995, pp. 219-221

DISCLOSURE OF THE INVENTION

With the method of PTL 1, the negative resistance is cancelled in a low frequency region so as not to generate any gain and suppress any parasitic oscillation by replacing diode element 63 with a resistance element whose resistance is substantially same as the negative resistance of the RTD element 64 of FIG. 6. The low frequency as used herein is substantially of the order of kHz and MHz, although it may vary depending on the length of the cable for connecting the power bias circuit to the RTD element. However, the resistance value of a resistance element as described above is about tens of several ohms ($\Omega$) and a DC current that does not participate in oscillation flows to the resistance element to provide a limit to improvement of power conversion efficiency. On the other hand, NPL 1 employs a diode element 63 to replace a resistance element as described above. Any parasitic oscillation is prevented from appearing by selecting a differential resistance value that can cancel the negative resistance for the diode element 63 near the bias voltage when the RTD element is driven to oscillate. With such an arrangement again, a DC current is made to flow to an element other than the RTD element to provide a limit to reduction of power consumption.

Furthermore, both a resistance element and a diode element emit heat to consume electric power as an electric current is made to flow to them. Then, as a result, the RTD element is heated as heat emitting members are integrally arranged near the RTD element to reduce the service life and the gain of the element.

In an aspect of the present invention, an oscillator according to the present invention comprises a negative resistance element and a resonator along with a capacitor electrically connected in parallel with the negative resistance element relative to a power bias circuit, a capacitance of the capacitor being so selected as to suppress any parasitic oscillation due to the power bias circuit and allow oscillation at a resonance frequency due to the negative resistance element and the resonator.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF EMBODIMENTS

Preferred embodiments of the present invention will now be described in detail in accordance with the accompanying drawings.

What is important for the oscillator of the present embodiment of the present invention is the following. Namely, it is to select a capacitance of a capacitor electrically connected in parallel with a negative resistance element relative to a power bias circuit so as to suppress any parasitic oscillation due to the power bias circuit and allow oscillation at a resonance frequency due to the negative resistance element and the resonator. In other words, if the capacitor is formed by a single part, the part operates to suppress any parasitic oscillation and generate oscillation at a desired resonance frequency. If, on the other hand, the capacitor is formed by a plurality of parts, the parts cooperate to suppress any parasitic oscillation and generate oscillation at a desired resonance frequency. On the basis of this idea, the oscillator of this embodiment has the above-described basic configuration.

According to the basic configuration, an oscillator according to the present invention may have a more specific configuration as described below. For instance, part of the resonator operates as two electrodes of the negative resistance element and the capacitor is electrically connected in parallel with the electrodes. Then, the capacitance C of the capacitor is selected in a manner as described below. Namely, a cut-off angular frequency $\omega=1/(CR)$ that is determined by a total resistance R of the power bias circuit connected to the capacitor is selected to be smaller than a fundamental resonance frequency of a loop feedback circuit formed by the power bias circuit and the negative resistance element (refer to the embodiments that are described hereinafter). The capacitor and the negative resistance element may be separated by about ¼ of the oscillation wavelength which corresponds to a resonance frequency in terms of electrical length and connected by a line (refer to Embodiment 1 that is described hereinafter). The capacitor may include two or more than two capacitors having different capacitances and connecting to the negative resistance element in parallel and the capacitance of the capacitor located remoter from the negative resistance element may have a greater capacitance (refer to the embodiments that are described hereinafter).

Embodiment 1

Figure 1A:
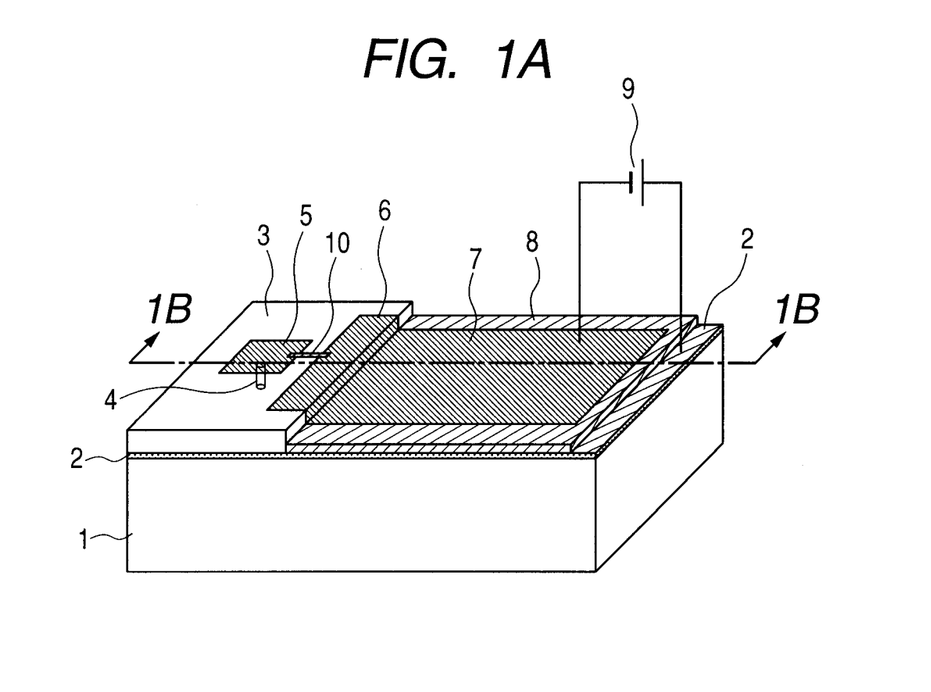
FIG. 1A is a schematic perspective view of the oscillator of Embodiment 1 of the present invention.
Figure 1B:
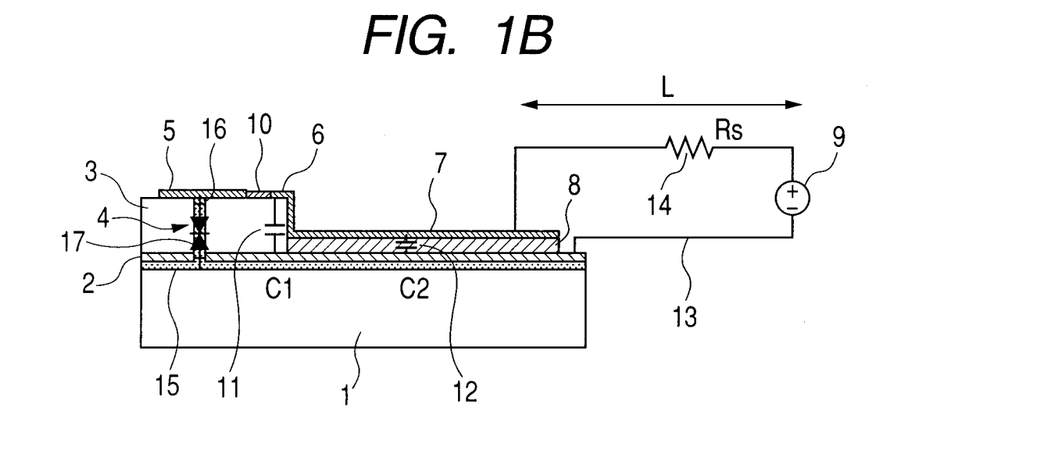
FIG. 1B is a schematic cross-sectional view of the oscillator of Embodiment 1 of the present invention.

Embodiment 1 of the present invention has a structure formed by integrating an RTD element and a large capacitance capacitor on a same substrate. FIGS. 1A and 1B illustrate the structure thereof, of which FIG. 1A is a schematic perspective view and FIG. 1B is a schematic cross-sectional view taken along 1B-1B in FIG. 1A. In FIGS. 1A and 1B, 4 denotes a post-shaped RTD element and the structure further includes epitaxial layers including an InGaAs/AlAs or InGaAs/InAlAs quantum well 17, a pair of contact layers 15, 16 and spacer layers (not illustrated) formed on an InP substrate 1 by crystal growth thereof. A negative resistance element formed by using a III-V group compound semiconductor such as AlGaAs/GaAs on a GaAs substrate and AlGaN/InGaN on a GaN substrate, a IV group semiconductor such as Si/SiGe on an Si substrate, and a II-VI group semiconductor may also be applicable.

The resonator is formed by an electrode 2 that also operates as a ground plane, an electrode 5 that also operates as a patch antenna and a power supply, and a dielectric 3 sandwiched between them. A dielectric 3 showing only little loss in the region of oscillation thereof is preferable. Preferable exemplar dielectrics include BCB (tradename: Benzocyclobutene), polyimide, polyethylene and polyolefin and BCB is employed here. As seen from FIG. 1B, one of the contacts of the RTD element 4 is connected to the ground plane electrode 2 by way of n+InGaAs contact layer 15, while the other contact is connected to the electrode 5 that is turned to a patch antenna by way of n+InGaAs contact layer 16. The antenna 5 is electrically connected to a line 10 and electrodes 6 and 7 that form a capacitance element so that power can be bias-supplied to the RTD element 4 by way of a cable line 13 and the electrodes 2 and 7 from electrical power supply 9.

In this embodiment, a first capacitor $C_1$ (11) of a relatively small capacitance (of a magnitude of the order of pF) is formed near the RTD element 4 by way of the line 10. Desirably, it is formed at a position within ¼ of the oscillation wavelength λ from the RTD element 4 in order to stably secure stability of design oscillation wavelength of the oscillator. For example, if the oscillation frequency is 0.5 THz, the wavelength in a free space is about 600 μm and hence the electrode 6 of the first capacitor 11 is provided at a position separated by a distance of about 150 μm. In the case of a patch antenna 5, it is sufficient that the length of the line 10 is about λ/4. In actuality, the oscillator is designed with the effective length for which the wavelength reducing effect is taken into consideration because of the presence of a dielectric so that the distance is about a half of the distance in a free space although the distance may depend on the material that is employed. This is due to the fact that the length that is generally referred to as intra-tube wavelength or electrical length is reduced by about $1-\sqrt{\in_{\mathit{eff}}}$, where $\in_{\mathit{eff}}$ is the effective dielectric constant. Then, the capacitor that operates as the first capacitor shares the dielectric 3 for forming the patch antenna 5. Due to the provision of the first capacitor, it is possible to oscillate only at a desired oscillation frequency, preventing the parasitic oscillation attributable to the line necessary for supplying a bias to a certain extent. If the capacitance of the first capacitor is 1 pF, the size of the electrode 6 is about $10^{-7}$ m$^2$ when the dielectric 3 is made of BCB (specific dielectric constant 2.7) and has a thickness of 3 μm (which may vary depending on the height of the post of the RTD element). This is calculated from the relationship of $C=\in S/d$ (where S is the electrode area, d is the distance between the electrodes and ∈ is the dielectric constant of the dielectric). Thus, the electrode 6 may have sides that are about several times of 100 μm long.

Then, for this embodiment, a second capacitor $C_2$ (12) of a relatively large capacitance (of a magnitude of the order between nF and μF) is connected in parallel with the first capacitor close to the bias circuit of the first capacitor. A material 8 having a large dielectric constant is selected, and then made to show a small thickness. The second capacitor 12 can be made to show a capacitance of about 100 nF by using a high dielectric constant material (e.g., titanium oxide and barium titanate), for example a specific dielectric constant of not less than several times of 10, a thickness of about 0.1 μm and an area of 1 cm² (with 1 cm sides). In this embodiment, the plurality of capacitors is integrated on a same substrate. While both of the electrodes 6 and 7 are drawn to show a same width in FIGS. 1A and 1B, they may produce a step not only in the direction of height but also in the width direction as long as the electrodes 6 and 7 are electrically connected each other.

Figure 2:
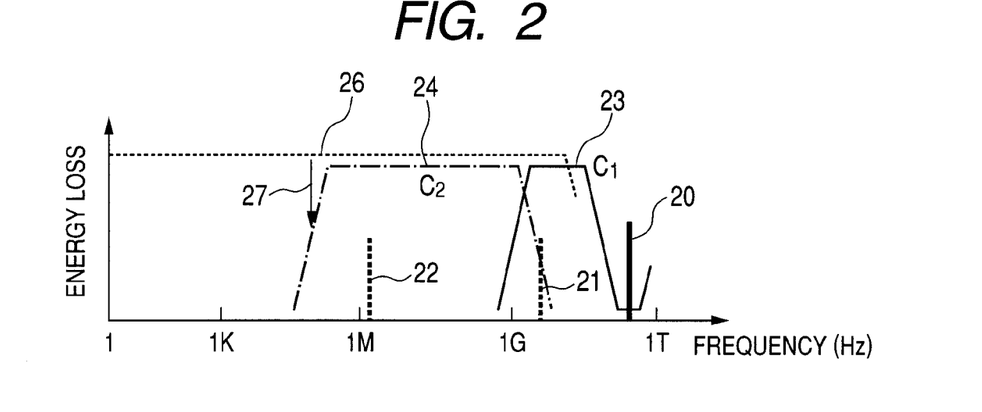
FIG. 2 is a graph illustrating the relationship between the frequency band and the quantity of energy loss for a description of the principle of the present invention.

Now, the effect of suppression of parasitic oscillation will be described below in detail by referring to FIG. 2 that illustrates frequency bands. In FIG. 2, the horizontal axis is a logarithmic axis that shows steps of 1,000 Hz for frequencies starting from 1 Hz up to 1 THz. The vertical axis schematically shows the energy loss quantities at the oscillation circuit and at the power bias circuit with an arbitrarily selected scale. In FIG. 2, the trapezoidal graph 23 drawn by a solid line shows the characteristic determined by the first capacitor $C_1$ to prove that the loss is small at the desired oscillation frequency as indicated by a thick solid line 20 (e.g., 700 GHz) but increases at frequencies below the desired frequency. Additionally, due to the limit of the capacitance of the first capacitor, the effect of suppression is small and the quantity of energy loss decreases at frequencies below several times of 10 GHz. This is because a filter element is formed with a cut-off frequency f that is defined by the formula (1) shown below, where Rs is the resistance (14) that is the sum of the internal resistance of the bias circuit and the resistance of the cable line 13 and $C_1$ is the capacitance of the capacitor.

$$f=1/(C_1 \cdot Rs \cdot 2\pi) \qquad (1)$$

Thus, assuming that Rs≈10Ω, the cut-off frequency that is formed with a capacitor $C_1$ having a capacitance of 1 pF and resistor Rs having a resistance of 10Ω is about 16 GHz. To date, the loss is increased by a resistance element or a diode element because of the parasitic oscillation that arises at below the cut-off frequency. This is the characteristic indicated by the dotted line 26 in FIG. 2 and a window region that is free from loss at the point of oscillation 20 is formed by arranging such an element at a position separated from the RTD element by λ/4 for oscillations.

In this embodiment, the parasitic oscillation in a lower frequency region is suppressed by utilizing the trapezoidal characteristic graph of a chain line 24 produced by the second capacitor 12 without using a resistance element. In other words, if the capacitance of the capacitor $C_2$=10 nF, the cut-off frequency 27 is about 1.60 MHz as it is determined by the above formula (1) (as for the part of $C_1$, $C_1+C_2 \approx C_2$) so that the frequency can be made lower than the point of oscillation 22 of the power bias circuit. The frequency of the oscillation attributable to the power bias circuit is determined by the condition of oscillation of the two terminal loop feedback circuit using the RTD element 4 as gain element. In other words, if the cable line length is L, the effective specific dielectric constant propagating through the cable line is $\in_{eff}$ and the speed of light is $c_0$, the resonance frequency 22 of the power bias circuit is expressed by the formula (2) shown below.

$$f=c_0/\lambda=c_0/(2L\sqrt{\in_{eff}}) \qquad (2)$$

For example, if two lead wires of L=1 m are employed for connection and $\in_{eff}$=1 is assumed, the resonance frequency is about 150 MHz. Then, as a result, any parasitic oscillation attributable to the bias circuit can be suppressed by the second capacitor 12. The cut-off effect of the second capacitor for a higher frequency band is determined by the dielectric for forming the capacitance element in the case of a MIM (metal-insulator-metal) structure and the use of a dielectric material whose dielectric constant does not significantly change up to about several times of 10 GHz may be satisfactory.

While a resonance point 21 can take place due to reflection or the like depending on the discontinuous quantity of the first capacitor and the second capacitor, it is desirably found in the suppressible frequency band of the first capacitor. From the description given above by referring to FIG. 2, it will be clear that a resonator according to the present invention needs to be designed so as to establish a proper relationship for the total series resistance Rs of the bias circuit, the frequency of the oscillation attributable to the bias circuit and the cut-off frequency produced by the first and the second capacitors. In other words, with such an arrangement, any parasitic oscillation can be suppressed without using a resistance element and the ineffective DC current that does not participate in oscillation can be minimized.

Then, as a result, the design of the RTD element becomes subject to changes depending of the cable resistance of the power bias circuit, the internal resistance of the power source and the cable length, and there is a restriction that no biasing is possible in the negative resistance region unless the total resistance value is smaller than the absolute value of the negative resistance of the RTD element 4. This is because the total series resistance Rs attributable to the power bias circuit determines the inclination −1/Rs of the load line for driving the element. When Rs is greater than the negative resistance, or −1/Rs>−1/Rrtd, the load line intersects the I-V curve of the RTD before and after the negative resistance region so that a skip takes place to either of the stable points for biasing (see, for example NPL 2).

The above description can be summarized as follows. In this embodiment, a capacitor is arranged to replace a resistance element etc. Then, the capacitance of the capacitor is so determined as to provide a cut-off frequency (inversely proportional to the product of multiplication of the capacitance by the resistance) that is smaller than the resonance frequency (e.g., 150 MHz) that is determined by the length of the power bias circuit and other factors. This is because the length of the arrangement other than the power bias circuit is shorter and hence the cut-off frequency will be greater than the resonance frequency. On the other hand, the capacitance is proportional to the dielectric constant and the area and inversely proportional to the distance between the electrodes. The dielectric that is selected to form the oscillation circuit including the RTD element should show little loss for the electromagnetic wave produced by oscillation of the oscillation circuit and the structure of the oscillation circuit needs to be so determined as to realize impedance matching with air. While the area needs to be large in order to provide a large capacitance, a too large area is not desirable because the components such as the resistance other than the capacitance increase accordingly and the desired high frequency characteristic may not be obtained when the area is increased. For this reason, a first capacitor having the above-described capacitance and a second capacitor having a different capacitance are provided. Any electromagnetic wave showing a resonance frequency that is determined by the discontinuous quantity of impedance and the electrical length between the first capacitor and the second capacitor needs to be cut out by the first capacitor because the second capacitor cannot suppress oscillation if it is not cut out by the first capacitor. Since the resonance frequency becomes small when the electrical length between the first capacitor and the second capacitor increases (see the formula (2) above), the electrical length should be such that the first capacitor can cut out the electromagnetic wave of the resonance frequency.

While two capacitors of capacitance elements of two different types having different capacitances are connected in parallel and stepwise in the above-described embodiment from the viewpoint of easiness of preparation of the elements, alternatively a single capacitance element showing a large capacitance may integrally be arranged near the negative resistance element. In other words, a single capacitance element may be sufficient when the capacitance of the first capacitor can be made satisfactorily large and the cut-off frequency at the low frequency side can be made smaller than the oscillation point 22 that is attributable to the power bias circuit. Still alternatively, a structure where the capacitance changes in a graded manner and hence a structure where the thickness of the dielectric changes gradually at the connecting section and the size of the upper electrode gradually increases may be employed. A similar effect can be achieved by using a structure where three or more than three capacitors are arranged stepwise.

With this embodiment, an oscillator showing high power conversion efficiency and emitting little heat can be provided by using capacitors to suppress the parasitic oscillation attributable to the power bias circuit and so on. Then, as a result, it is possible to realize an oscillator having a structure that can reduce the power consumption, improve the service life and prevent any decrease of gain. Additionally, a very compact terahertz imaging apparatus and terahertz analyzing device showing a very low power consumption rate can be realized by using such an oscillator.

Example 1

A specific example of arrangement of elements of Embodiment 1 will be described below. In this example, an RTD element is formed on an InP substrate. A triple barrier quantum well structure having a first barrier layer AlAs (1.3 nm), a first quantum well layer InGaAs (7.6 nm), a second barrier layer InAlAs (2.6 nm), a second quantum well layer InGaAs (5.6 nm), a third barrier layer AlAs (1.3 nm) is employed. All the composition ratios are lattice-matched to the InP substrate except AlAs. On the other hand, AlAs is a strained layer but the thickness is less than the critical film thickness. A spacer layer made of non-doped InGaAs, an n-type InGaAs electric contact layer and an n+InGaAs contact layer are arranged at the top and also at the bottom of the triple barrier quantum well structure. The RTD element post is circular with a diameter of about 2 µm. Then, current voltage characteristics including a current density of Jp=280 kA/cm², a peak valley ratio of 3 and a differential negative resistance of about −22Ω can be obtained due to the photon assist tunnel phenomenon. The electrode 5 of the patch antenna has a square pattern of 150 µm×150 µm and the post is located at a position moved for 40 µm from the center thereof in parallel in the direction of moving away from the electrode 6. The resonator is prepared so as to make the patch antenna resonator and the RTD element show impedance matching. Since the antenna size approximately corresponds to λ/2, the oscillation frequency is about 530 GHz.

The electrodes 2 and 5 are made of Ti/Pd/Au (20 nm/20 nm/200 nm). The line 10 has a width of 12 µm and a length of 75 µm and is designed to be a λ/4 line relative to the oscillation wavelength of 530 GHz. The electrode 6 for forming the first capacitor is made to show a rectangular profile of 200 µm×1,000 µm so as to have a capacitance of several pF. For the second capacitor, the dielectric 8 is made of titanium oxide (0.1 µm thick) showing a dielectric constant of about 30 and the electrode 7 is made to show a profile of 1,000 µm×1,000 µm so as to have a capacitance of about 2 nF. Then, the cut-off frequency is about 8 MHz when connected to a power bias circuit of 10Ω so that oscillation is obtained with a fundamental wave of 530 GHz without giving rise to any parasitic oscillation if the cable is shorter than about 18 m.

Embodiment 2

Figure 3:
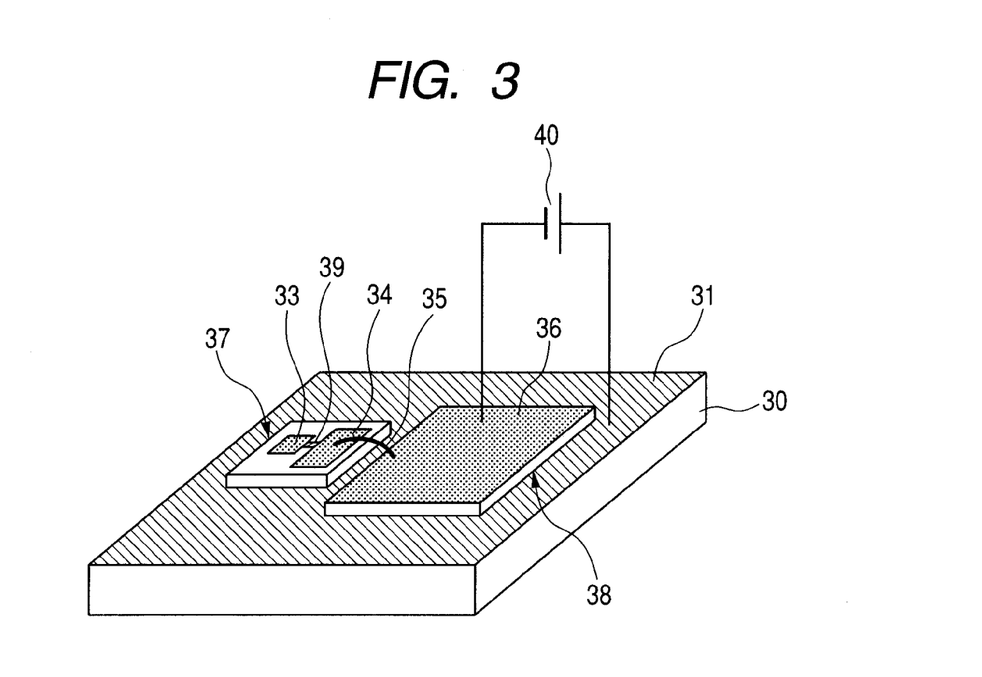
FIG. 3 is a schematic perspective view of the oscillator of Embodiment 2 of the present invention.

Embodiment 2 of the present invention has such a structure that a second capacitor is installed on a same mount as a separate chip as illustrated in FIG. 3. In FIG. 3, 30 denotes a sub-carrier for installing the chips. A substrate prepared by coating an electroconductive layer 31 such as Au on a ceramic substrate such as Si substrate, $Al_2O_3$ and AlN or on a plastic substrate or a metal plate may selectively be employed for the sub-carrier 30. 37 denotes an RTD element chip or a single chip realized to carry the RTD element and components down to the part that corresponds to the first capacitor of Embodiment 1. A patch antenna 33 and an electrode 34 are connected by a line 39. Note, however, that the capacitance of the part that corresponds to the first capacitor needs to be made larger than that of Embodiment 1. One of the contacts of the RTD element is connected to the electroconductive layer 31 of the sub-carrier and the other contact is connected to one of the electrodes (36) of chip capacitor 38 that forms a second capacitor by means of Au wire bonding 35. While there is a single wire bonding 35 in FIG. 3, a plurality of wire bondings may be provided if necessary. The other electrode of the chip capacitor 38 is electroconductively connected to the electroconductive layer 31 of the sub-carrier. Resonance point 21 in the frequency band of FIG. 2 that arises due to the discontinuity of the first capacitor and the second capacitor is determined by the connecting length of the wire bonding 35 and the cut-off frequency for the capacitance of the first capacitor needs to be made smaller than the resonance point. For this reason, the capacitance of the first capacitor is made larger than that of Embodiment 1.

Power bias circuit 40 is connected to the electrode 36 of the chip capacitor and the electroconductive layer 31 of the sub-carrier. This embodiment provides a higher degree of freedom and a relatively large capacitor such as 1 µF can be connected because separate capacitors can be selected and installed in this embodiment. A high degree of freedom can increase for the cable length and the resistance of the power bias circuit to be used because the lower cut-off frequency falls when the capacitance increases. When the total resistance Rs is 10Ω as in Embodiment 1 and the capacitor has a capacitance of 1 µF, the cut-off frequency is about 16 kHz, therefore Embodiment 2 provides an effect of suppressing any parasitic oscillation so long as the cable length is of the order of km.

While the second capacitor is a chip capacitor, components down to the second capacitor may be integrated with the RTD element and the third capacitor and the subsequent components may be realized as a separate chip by taking the parasitic inductance due to individual capacitors into consideration.

Embodiment 3

Figure 4:
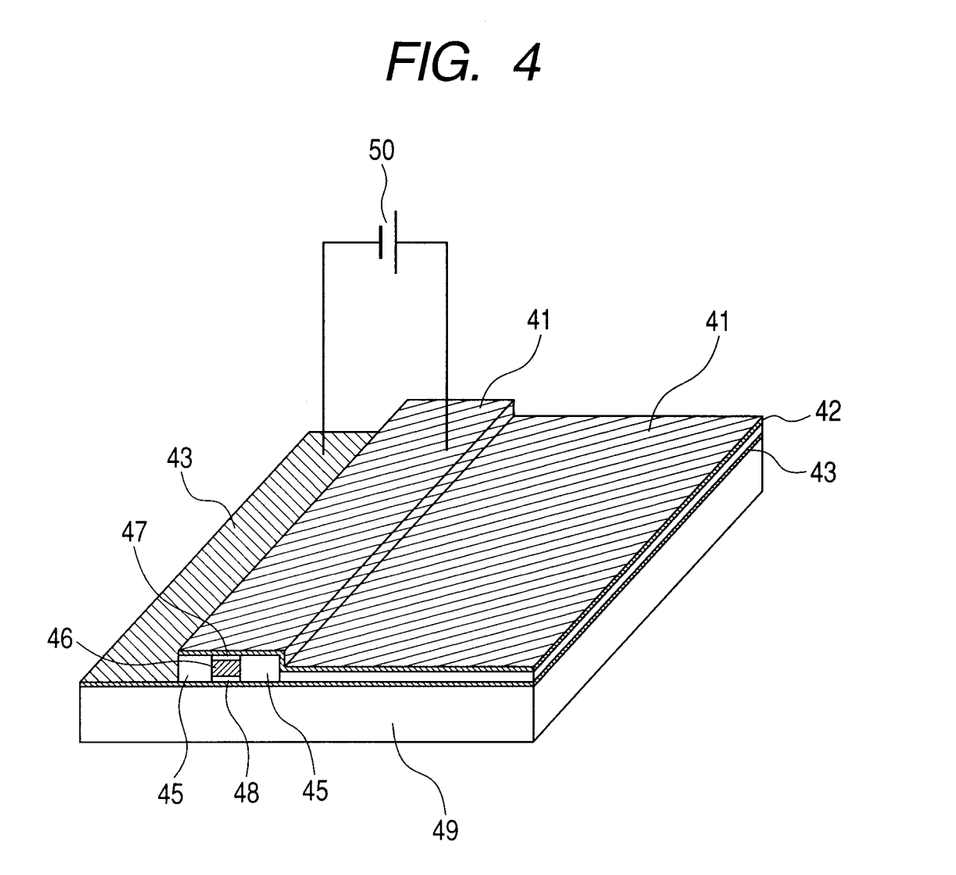
FIG. 4 is a schematic perspective view of the oscillator of Embodiment 3 of the present invention.

A resonator disclosed in Embodiment 3 of the present invention has a stripe-shaped resonator formed by an RTD element as illustrated in FIG. 4. The crystal structure of the RTD element has structure such as the semiconductor described in Example of Embodiment 1, for example, a layer 46 including an InGaAs/AlAs multiple quantum well formed by epitaxial growth on an InP substrate and n+InGaAs 47, 48 that operate as contact layer. When forming such a stripe-shaped structure, it is difficult to use a dielectric waveguide in the terahertz band and a double plasmon waveguide formed by sandwiching a substrate between metal plates is preferably employed. For this reason, the substrate 49 illustrated in FIG. 4 is not an epitaxially grown substrate but a substrate holding epitaxial thin films 46 to 48. GaAs or InP is suitably employed as a material having an expansion coefficient close to that of an epitaxial thin film. An Si substrate or a ceramic substrate may also be used. A metal film 43, Ti/Au thin film for example, is formed on the surface of the substrate 49 and bonded to an epitaxially grown film by Au—Au metal bonding (not illustrated), and the InP substrate that is used at the time of growing the epitaxially grown film is removed by etching.

In FIG. 4, reference sign 45 denotes a dielectric section formed by BCB resin around the epitaxial layer and a first capacitor is formed by the dielectric section 45, an upper electrode 41 and a lower electrode 43. As for the dimensions of the components, for example, the layer 46 including the multiple quantum well has a width of 20 μm and the assemble including the dielectric section 45 is 300 μm wide, while the strip has a length of 500 μm, although the dimensions may be selected depending on the epitaxial structure and the designed oscillation frequency.

On the other hand, a dielectric 42 having a high dielectric constant and a thin thickness (e.g., 0.1 μm thick titanium oxide thin film) unlike the dielectric section 45 is formed around the stripe-shaped region and a second capacitor is formed by the electrode 41 extended from the stripe-shaped section and the electrode 43. As illustrated in FIG. 4, power bias circuit 50 is connected to the electrode 41 and the electrode 43. Such a structure can suppress any parasitic oscillation with a mechanism same as the principle described for the above embodiments by means of a high output RTD element without using any resistance element.

The entire disclosure of Japanese Patent Application No. 2009-205673 filed on Sep. 7, 2009 including claims, specification, drawings and abstract are incorporated herein by reference in its entirety.

As many apparently widely different embodiments of the present invention can be made without departing from the spirit and scope thereof, it is to be understood that the invention is not limited to the specific embodiments thereof except as defined in the claims.

INDUSTRIAL APPLICABILITY

This invention relates to an oscillator having a negative resistance element for generating an electromagnetic wave (a terahertz wave in particular). Such an oscillator can find applications in tomography apparatus, spectrometric examination apparatus and radio communication equipment to operate as light source section.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-205673, filed Sep. 7, 2009, which is hereby incorporated by reference herein in its entirety.

The invention claimed is:
1. An oscillator comprising:
a negative resistance element;
a resonator; and
a capacitor electrically connected in parallel with the negative resistance element relative to a power bias circuit,
wherein part of the resonator is adapted to operate as two electrodes of the negative resistance element,
wherein a capacitance of the capacitor is such that a cut-off frequency is smaller than a fundamental resonance frequency of a loop feedback circuit that is formed by the power bias circuit and the negative resistance element,
wherein the cut-off frequency satisfies a formula of $f=1/(2\pi CR)$ where f represents the cut-off frequency, C represents the capacitance, and R represents a total resistance of the power bias circuit, and the oscillator is adapted to oscillate electromagnetic waves in a frequency region from more than 30 GHz and not more than 30 THz.

2. The oscillator according to claim 1, wherein
the capacitor and the negative resistance element are separated by ¼ of the oscillation wavelength which corresponds to a resonance frequency in terms of electrical length and connected by a line.

3. The oscillator according to claim 1, wherein
the capacitor comprises two or more than two capacitors having different capacitances and connecting to the negative resistance element in parallel and the capacitance of the capacitor located remoter from the negative resistance element has a greater capacitance.

4. The oscillator according to claim 3, wherein
the two or more than two capacitors are integrated on a same substrate.

5. The oscillator according to claim 1, wherein
a total resistance of the power bias circuit is smaller than an absolute value of a negative resistance of the negative resistance element.

6. The oscillator according to claim 1, wherein
the capacitance C of the capacitor is adapted to suppress any parasitic oscillation due to the power bias circuit and to allow oscillation of the electromagnetic waves due to the negative resistance element and the resonator.

7. An oscillator oscillating a terahertz wave, comprising:
a resonator including a first electrode, a second electrode, and a dielectric disposed between the first electrode and the second electrode;
a resonant tunneling diode electrically connected with the first electrode and the second electrode; and
a capacitor electrically connected in parallel with the resonant tunneling diode,
wherein the resonant tunneling diode is supplied a bias by a power bias circuit by way of the first electrode and the second electrode,
wherein the capacitor has a first capacitor electrically connected with the resonant tunneling diode and a second capacitor electrically connected with the resonant tunneling diode, wherein a distance between the second capacitor and the resonant tunneling diode is shorter than a distance between the first capacitor and the resonant tunneling diode, and wherein a capacitance of the second capacitor is larger than a capacitance of the first capacitor.

8. The oscillator according to claim 7, wherein the first capacitor includes part of the dielectric and part of the second electrode.

9. The oscillator according to claim 8, wherein the second capacitor includes the part of the second electrode.

10. The oscillator according to claim 9, wherein a thickness of a dielectric of the second capacitor is smaller than a thickness of a dielectric of the first capacitor.

11. The oscillator according to claim 9, wherein a dielectric constant of the dielectric of the second capacitor is larger than a dielectric constant of the dielectric of the first capacitor.

12. The oscillator according to claim 7, wherein the first capacitor and the second capacitor are integrated on a same substrate.

13. The oscillator according to claim 7, wherein the capacitor has a structure where a capacitance changes in a graded manner.

14. The oscillator according to claim 7, wherein the resonator, the resonant tunneling diode, and the first capacitor are formed into a single chip.

15. The oscillator according to claim 7, wherein the resonator includes a patch antenna.

16. The oscillator according to claim 7, wherein the resonator includes a plasmon waveguide.

* * * * *